United States Patent [19]
Janning

[11] Patent Number: 4,619,034
[45] Date of Patent: Oct. 28, 1986

[54] METHOD OF MAKING LASER RECRYSTALLIZED SILICON-ON-INSULATOR NONVOLATILE MEMORY DEVICE

[75] Inventor: John L. Janning, Dayton, Ohio

[73] Assignee: NCR Corporation, Dayton, Ohio

[21] Appl. No.: 710,192

[22] Filed: Mar. 11, 1985

Related U.S. Application Data

[62] Division of Ser. No. 490,743, May 2, 1983, abandoned.

[51] Int. Cl.[4] .................... H01L 21/263; C30B 13/06
[52] U.S. Cl. .................................. 29/571; 29/576 B;
148/1.5; 148/187; 148/DIG. 77; 148/DIG. 91;
357/23.1; 357/91; 427/53.1
[58] Field of Search ............... 29/571, 576 B; 148/1.5,
148/187; 357/91, 23.1; 427/53.1

[56] References Cited

U.S. PATENT DOCUMENTS

| | | | |
|---|---|---|---|
| 4,409,724 | 10/1983 | Tasch, Jr. et al. | 29/576 B |
| 4,414,242 | 11/1983 | Nishimura et al. | 427/53.1 |
| 4,448,632 | 5/1984 | Akasaka | 148/1.5 |
| 4,467,518 | 8/1984 | Bansal | 29/571 |
| 4,487,635 | 12/1984 | Kugimiya et al. | 148/1.5 |
| 4,494,300 | 1/1985 | Schwuttke et al. | 29/571 |
| 4,543,133 | 9/1985 | Mukai | 148/1.5 |

OTHER PUBLICATIONS

Gibbons et al. IEEE–Electron Device Letts. EDL-1, (1980), p. 117.
Colinge et al. IEEE–IEDM (1981), p. 557.
Colinge et al. IEEE–Trans. Electron Devices, ED-29 (1982) 585.

Primary Examiner—Upendra Roy
Attorney, Agent, or Firm—J. T. Cavender; Casimer K. Salys

[57] ABSTRACT

Disclosed is a nonvolatile memory device which utilizes a laser beam recrystallized silicon layer having source-channel-drain regions. Underlying the recrystallized layer and separated therefrom by a memory dielectric is a gate in alignment with the source and drain. The gate is formed directly on a substrate of an insulative material (e.g. non-silicon material).

The process of forming the above device comprises forming a conductive polysilicon gate on a substrate followed by a memory nitride layer deposition thereon. A thick oxide layer is formed over the nitride followed by removal of the thick oxide corresponding to a central portion of the gate thereby exposing the nitride therebeneath. The exposed nitride surface is thermally converted into a thin, stoichiometric memory $SiO_2$. A doped polysilicon layer is then formed on the structure and thereafter converted to recrystallized silicon by subjecting it to laser radiation. The recrystallized silicon is patterned into the device active area and a source and drain in alignment with the underlying gate are implanted therein.

7 Claims, 6 Drawing Figures

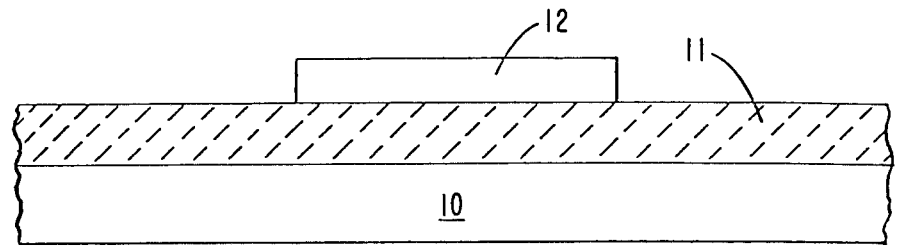
FIG. 1
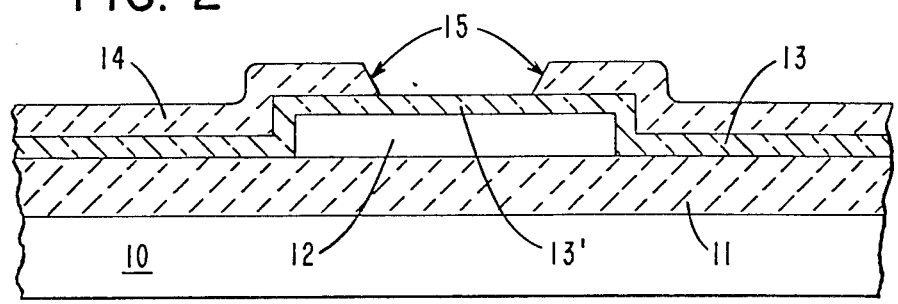
FIG. 2
FIG. 3
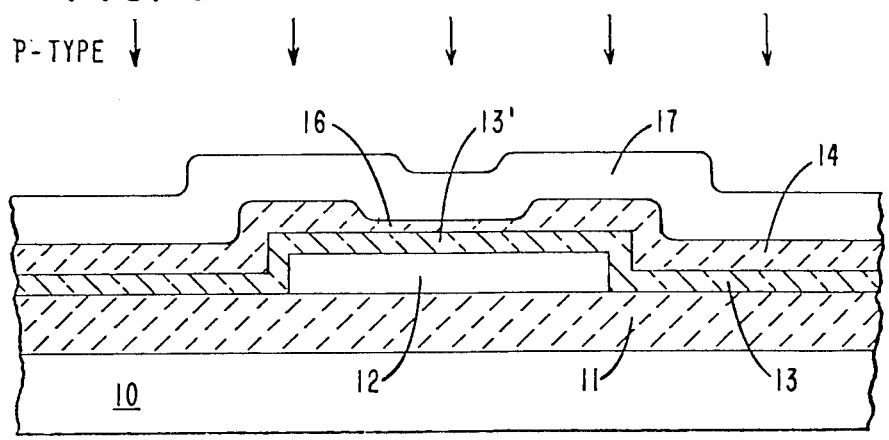

METHOD OF MAKING LASER RECRYSTALLIZED SILICON-ON-INSULATOR NONVOLATILE MEMORY DEVICE

This application is a division of application Ser. No. 490,743 filed May 2, 1983, and now abandoned.

BACKGROUND OF THE INVENTION

This invention is directed to silicon on-insulator (SOI) memory elements and in particular, a laser beam recrystallized SOI memory element having multiple gate insulating layers and a method of making the same.

Metal-nitride-oxide-semiconductor (MNOS) memory devices and their silicon gate counterpart (SNOS) devices are well-known non-volatile memory devices capable of storing charges in a thin memory oxide sandwiched between the nitride film and the semiconductor substrate. (Hereafter, MNOS includes SNOS). The conventional process of fabricating a SNOS device typically involves the use of monocrystalline silicon starting material and after forming thick silicon dioxide regions which electrically isolate adjacent devices on the semiconductor chip (typically, by localized oxidation of silicon process) a thin (of the order of about 25 Angstroms) memory oxide film is grown over the gate region by thermal oxidation of the silicon substrate. Another technique of forming the memory oxide is by chemical vapor deposition. Immediately after forming the memory oxide a relatively thick (of the order of 400 Angstroms) silicon nitride is deposited on the oxide film by, for example, low pressure chemical vapor deposition (LPCVD) followed by metal/polysilicon gate formation on the nitride layer.

In the above conventional SNOS process when the memory oxide is formed by thermal oxidation of the silicon substrate, the oxide is invariably not stoichiometric $SiO_2$ but contains free silicon. Presence of free silicon in the memory oxide deleteriously affects the charge retention characteristic of the memory device. Another disadvantage of forming the memory oxide by thermal oxidation of the silicon substrate is that it is difficult to control the oxide thickness due to high rate of silicon oxidation even at relatively low temperatures. Likewise, when the memory oxide is formed by CVD, the ultra-thin nature (typically 4–5 atoms thick) of the memory oxide necessitates very careful control of the oxide deposition. In addition, both these memory oxide forming techniques present serious difficulties in forming a uniform oxide free of pin holes and other defects. In other words, the prior art technique of forming the SNOS device memory oxide is wrought with lack of oxide integrity and/or the oxide thickness uncertainty. Since the thickness of the memory oxide determines the retention and speed of the device, uncertainty in memory oxide thickness introduces uncertainties in the device characteristics. Yet another disadvantage of the conventional SNOS scheme is the requirement of using a substrate of monolithic silicon material having only single crystals and which has relatively good electrical conductivity, high purity, etc. in order to achieve the necessary high performance (by high operational speed, etc.) of the memory device built thereon. All of these requirements add to the cost of the integrated circuit chip.

The present invention overcomes these and other problems associated with prior art SNOS devices by means of a novel structure and process of making the same.

SUMMARY OF THE INVENTION

It is an object of this invention to provide a silicon gate nonvolatile memory device having excellent retention.

It is another object of this invention to provide a silicon gate nonvolatile memory device which does not require monolithic single crystal silicon substrate.

It is yet another object of this invention to provide a manufacturing method of forming a silicon gate nonvolatile memory device which is highly reliable, accurately reproducible and economically viable.

One embodiment of the present invention comprises a nonvolatile memory trigate field effect transistor fabricated in laser-beam recrystallized silicon-on-insulator. The device comprises a thick insulating layer formed on a silicon/non-silicon substrate and having a conductive polysilicon gate electrode thereon. Overlying the gate is a multiple dielectric layer (e.g., nitride-oxynitride-oxide or nitride-oxide) consisting of a relatively thin memory section and relatively thick non-memory sections abutting the memory section and serving as the memory device gate insulator. Overlying the gate insulator is a relatively thick doped and laser-beam recrystallized silicon layer having source and drain formed in alignment with the gate and the region between the source and drain serving as the channel. This memory transistor has excellent charge retention, superior to the conventional SNOS transistors and offers high density design capability.

One example of the fabrication method of the above memory transistor is as follows. Starting from a low expansivity substrate material (there is no requirement that the substrate be silicon) a thick insulating layer such as silicon dioxide or silicon nitride is formed thereon. Then, a highly doped polysilicon gate is formed followed by deposition of a nitride layer over the gate and the insulating layer not covered by the gate. Next, a relatively thick silicon dioxide layer is formed over the nitride. Thereafter, the thick oxide overlying a central (memory) section of the gate is removed thereby exposing the nitride thereunder. The structure is then subjected to an oxidation step to convert in a controlled and slow manner the upper surface of the exposed nitride into a thin oxide layer. The thin oxide and nitride layers thus formed serve as the memory dielectric layers for the device. Thereafter, a relatively thick doped polysilicon layer is formed over the entire structure and it is subjected to a laser-beam anneal step to form recrystallized silicon. (Prior to laser anneal an encapsulant anti-reflective coating of nitride may be formed on the polysilicon layer.) The recrystallized silicon layer is then patterned into the transistor active area followed by masking the channel region with an implantation mask and forming source and drain regions therein.

BRIEF DESCRIPTION OF THE DRAWINGS

FIGS. 1–6 are cross-sectional representations of the sequential stages of fabricating a laser-beam recrystallized silicon-on-insulator non-volatile memory trigate field effect transistor in accordance with the present invention.

DETAILED DESCRIPTION OF THE PREFERRED EMBODIMENT

Figure 4:
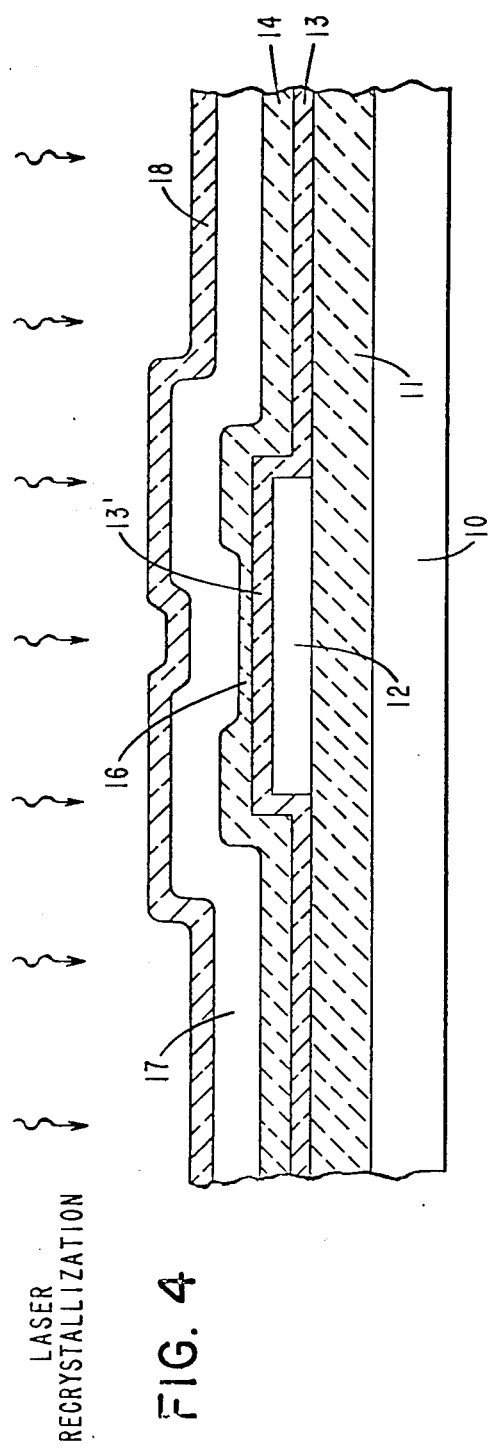

The invention will now be described, by way of example, with reference to the accompanying drawings. The example selected is a nonvolatile silicon trigate n-channel field effect transistor. Table I is an outline of the process sequence for forming the laser-beam recrystallized SOI nonvolatile silicon trigate n-FET memory device of the present invention. It should be noted that many of the techniques for implementing the various steps of the fabrication method are well-known in the art and may be implemented in a number of different ways which are readily apparent to those of ordinary skill in the art.

The thickness and other dimensions shown in the figures are selected for clarity of illustration and not to be interpreted in a limiting sense. The dimensions can be larger or smaller depending upon the operating environment in which the device is going to be used.

TABLE I

Process Flowchart for Laser-Beam Recrystallized Soi Nonvolatile Memory Device

1. Starting material: e.g., a high temperature glass
2. Isolation oxide formation (FIG. 1) (Optional)
3. Doped polysilicon gate formation (FIG. 1)
4. Memory nitride deposition (FIG. 2)
5. Thick LPCVD oxide formation over the nitride (FIG. 2)
6. Removal of LPCVD oxide over the memory section (FIG. 2)
7. Memory oxide formation over the nitride in the memory section (FIG. 3)
8. Polysilicon layer formation (FIG. 3)
9. Implantation of polysilicon layer with p-type (e.g. boron) ions (FIG. 3)
10. Anti-reflective nitride cap formation over polysilicon (FIG. 4)
11. Laser-beam recrystallization of polysilicon layer (FIG. 4)
12. Removal of nitride cap (FIG. 5)
13. Patterning recrystallized silicon into the device active area (FIG. 5)
14. Formation of implant mask over the recrystallized silicon layer in alignment with the gate (FIG. 5)
15. Implantation of n-type (e.g., phosphorus) ions in the unmasked recrystallized silicon forming source and drain (FIG. 5)
16. Removal of implant mask (FIG. 6)
17. Formation of low temperature oxide (FIG. 6)
18. Formation of contact holes and metallization (FIG. 6)

The starting material i.e., the substrate is a wafer of a material having a low coefficient of thermal expansion comparable to that of semiconductor materials such as silicon dioxide and silicon nitride. In other words, the expansivity of the substrate material should not only be low but should match the expansivities of various material layers that will be formed on the substrate lest these various overlying layers are prone to cracking. Suitable substrate materials are silicon, high temperature glasses, aluminum oxide and ceramics. In the figures, the substrate 10 represents only a small undivided part of the wafer. After appropriate cleaning, a thick layer 11 of insulating material such as silicon dioxide or silicon nitride is formed on the substrate 10 (step 2). Typical thickness of insulator layer 11 is about 10,000 Angstroms (1 micron). If layer 11 is oxide, it may be formed by chemical vapor deposition or in the case where the substrate 10 is silicon, by a high temperature (about 1,000 degrees C.) oxidation of the silicon. Layer 11 is called the isolation oxide and it electrically isolates/insulates the memory device from the substrate 10 and the peripheral circuitry. Layer 11 may be omitted if the substrate 10 is a high temperature glass material since in this case the substrate itself is capable of providing the necessary electrical isolation of the devices thereon. A polysilicon layer (hereafter, polysilicon I) of about 3,000 Angstroms is then formed, by a conventional process, such as LPCVD, over the entire surface of layer 11. Another technique of forming polysilicon I layer is by forming a thicker (of thickness of about 3,500 Angstroms) polysilicon layer over the oxide 11 and then oxidizing the nascent polysilicon I at a temperature of about 1000 degrees C. for a period of time. During this oxidation step, an oxide layer is formed on the polysilicon I by consumption of a surface layer of polysilicon I. Thereafter, the oxide on polysilicon I is etched off by conventional techniques. The polysilicon I layer formed in this manner will be free of surface asperities and spikes which could cause leakage currents and premature breakdown of the overlying gate dielectric layers (to be formed). The final thickness of polysilicon I formed in this manner is about 3,000 Angstroms.

Next, the polysilicon I layer is delineated and patterned into a polysilicon gate electrode 12 by conventional photolithographic and etching techniques. Gate electrode 12 is then doped, for example, by implanting with phosphorus ions of energy about 100 keV and dose $1.4 \times 10^{16}$ ions per square cm (step 3).

Referring now to FIG. 2, after forming the polysilicon gate 12, a silicon nitride layer 13 (about 400 Angstroms thick) is deposited (step 4) on the gate 12 and the isolation oxide 11 not covered by gate 12 by conventional LPCVD at a temperature of about 750 degrees C. and a pressure of about 400 millitorr.

Thereafter, referring to FIG. 2, a relatively thick (of thickness in the range 700–800 Angstroms) silicon dioxide layer 14 is formed over the nitride 13 (step 5). An exemplary technique of forming the oxide 14 is by LPCVD at a pressure of about 300 millitorr and a low temperature of about 420 degrees C. using a reactant gas mixture of silane and oxygen.

Next, referring to FIG. 2, the LPCVD oxide layer 14 overlying the nitride and corresponding to a central section 15—15 of the gate 12 is removed (step 6) by using conventional photolithographic and etching techniques thereby, exposing the portion designated by numeral 13' of the nitride 13.

Next, as shown in Fi9. 3, a thin (of thickness 10–40 Angstroms) oxide 16 is formed (step 7) over the exposed nitride portion 13'. The thin oxide 16 and the nitride portion 13' thereunder constitute the memory section of the gate insulator 14/16-13/13'. The thick oxide 16 and the nitride 13 therebeneath and overlying the gate 12 constitute the non-memory sections of the gate insulator 14/16-13/13'. One technique of forming the memory oxide 16 is by CVD. Another technique of forming the oxide 16 is by conversion treatment of the exposed nitride 13'. This is achieved by oxidizing the exposed nitride portion 13', for example, at a temperature of about 1,000 degrees C. in wet oxygen for a period of about 30 minutes, thereby converting the upper portion of the exposed nitride 13' into an oxide layer 16 of about 20 Angstroms thickness. Both these techniques of forming the memory oxide will yield a highly stoichiometric SiO$_2$ unlike the memory oxide formed in the conventional SNOS process by oxidation of the silicon substrate which yields a composite layer of silicon-rich oxide and a non-stoichiometric SiO$_2$. Forming memory oxide 16 by the conversion treatment technique is preferable to the CVD technique since it provides a much better control of the oxide 16 thickness than the CVD technique. Further, the conversion treatment technique of forming the oxide results in an ultra-thin transition layer of silicon oxynitride (not shown) sandwiched between the exposed nitride 13' and oxide 16 which is highly desirable as a memory dielectric layer. Another benefit of the conversion treatment technique is that during this step (step 7) the thick (non-memory) oxide 14 over the remainder (i.e. unexposed portion) of the nitride 13 will be densified.

Immediately after forming the memory oxide layer 16 as shown in FIG. 3, a second polysilicon layer 17 (hereafter, polysilicon II) of thickness about 4,500–5,000 Angstroms is formed over the memory oxide 16 and the thick oxide 14 by a conventional technique such as LPCVD (step 8). Forming the polysilicon immediately is essential for minimizing impurities on the memory oxide 16. Polysilicon II layer 17 is then doped lightly by ion implantation technique using, for example, boron ions of energy 35 keV and dose about $(1-20) \times 10^{12}$ ions per square cm (step 9). This doping provides the necessary conductivity for the polysilicon II layer 17 for forming a channel in correspondence with the underlying gate electrode 12.

Thereafter, as shown in FIG. 4, the polysilicon II layer 17 is capped with a nitride layer 18 of thickness of about 400–450 Angstroms and formed by a conventional process such as LPCVD (step 10). The nitride 18 is necessary for providing an anti-reflective coating over the polysilicon II layer 17 during the process step (step 11) of laser-beam recrystallization of polysilicon II layer 17 which ensues next.

Then, the polysilicon II layer 17 is exposed to a laser beam (step 11) to transform this layer from a polycrystalline silicon material into a material having single crystal islands. One example of the laser-beam recrystallization technique is mounting the wafer on a chuck heated to a temperature of about 500 degrees C. and using a continuous wave argon laser of spot size 45 microns, step size (i.e., displacement in the Y-direction) of 20 microns, beam power of about 4.5 watts and scanning the wafer (in the X-direction) at a speed of about 200 cm/sec. During the laser-beam recrystallization step, the high intensity of the laser beam will cause localized (i.e., non-uniform) heating of the polysilicon II layer 17 to a temperature exceeding about 1400 degrees C. and will convert localized regions of polysilicon II layer 17 from a solid to molten state. Upon cooling, these regions will recrystallize into a matrix of crystallites having various crystal orientations. The polysilicon II layer 17 recrystallized in this manner will be of device-quality material and will hereinafter be referred to as recrystallized silicon layer 17. During this laser beam recrystallization step, the polysilicon gate 12, due to its proximity to the polysilicon II layer 17 (note, the gate 12 is separated from layer 17 by only about 400–450 Angstroms thick memory insulator 13'-16 and about 700–850 Angstroms thick non-memory insulator 13-14) may also be recrystallized. However, laser recrystallization of polysilicon gate 12 will have no deleterious effect on the device performance.

Other techniques of transforming the polysilicon II layer 17 (FIG. 4) into recrystallized device-quality silicon which can be advantageously used in place of the laser beam include the e-beam, graphite strip heater and quartz lamp techniques.

Next, the nitride cap 18 is removed using concentrated hydrofluoric acid (step 12). Then, the recrystallized silicon II layer 17 is patterned by conventional photolithographic and etching techniques into the configuration 17' shown in FIG. 5 (step 13). The configuration 17' constitutes the active area of the field effect transistor that will be formed thereon.

Figure 5:
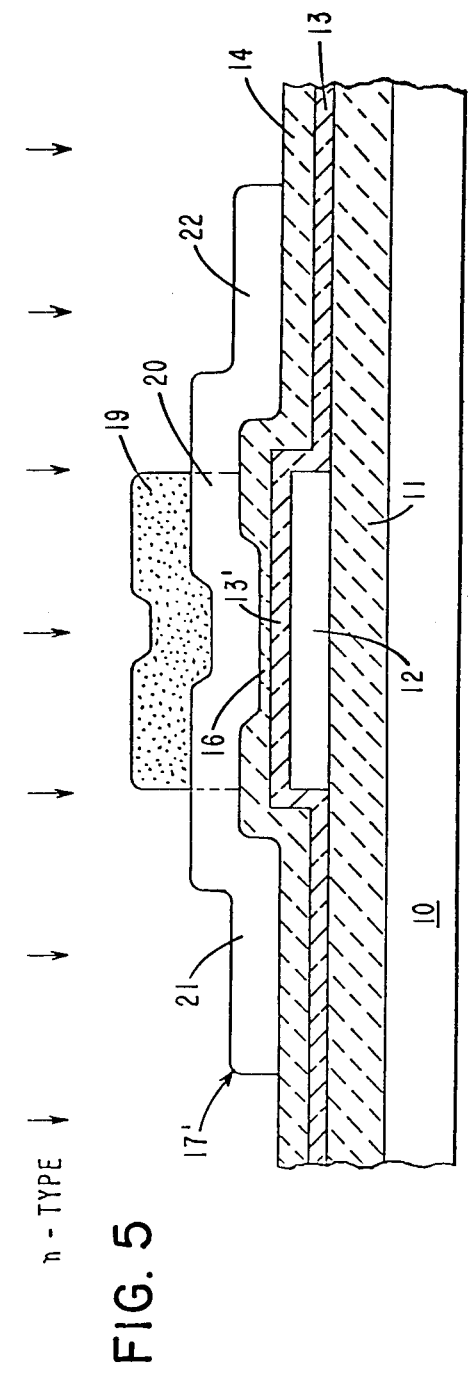
Figure 6:
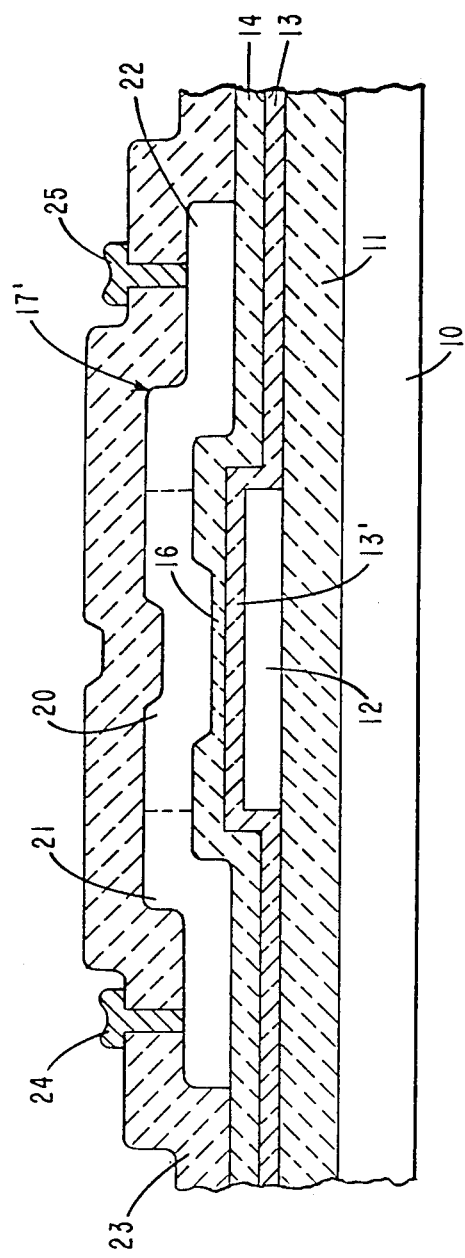

Thereafter, as shown in FIG. 5, an implant mask 19 is formed over the recrystallized silicon layer 17' in correspondence with the gate 12 (step 14). One suitable implant mask is a layer of photoresist material formed over the entire structure and delineated into the configuration shown in FIG. 5 by conventional techniques. Another suitable implant mask is a layer of silicon dioxide. To form an oxide implant mask, a layer of undoped silicon dioxide of thickness about 9,000–10,000 Angstroms is formed over the structure and then patterned by conventional photolithographic and etching techniques into the configuration shown in FIG. 5. Regardless of whether a photoresist or oxide implant mask is used, the implant mask 19 needs to be perfectly aligned with the gate 12. In other words, the implant mask 19 is formed to protect the channel region 20 from being doped during the source-drain implantation step (step 15) that follows next. This critical alignment is necessary also to ensure that the source and drain are aligned with the gate.

After forming the implant mask 19, referring to FIG. 5, the structure is subjected to an n-type ion implantation step to form the source 21 and drain 22 in the recrystallized silicon layer 17' (step 15). The implantation step 15 typically is accomplished by using phosphorus ions of energy about 80–100 keV and dose about $1 \times 10^{16}$ ions per square cm.

Referring to FIGS. 5 and 6, the next step of the fabrication process is removal of the implant mask 19 (step 16) and forming a thick (typically about 9,000–10,000 Angstroms thickness) low temperature oxide (LTO) layer 23 at a temperature of about 420 degrees C. (step 17). The LTO 23 is then densified at a temperature of about 900 degrees C. in a nitrogen environment. During this densification step, activation of the n-type ions introduced in the source and drain regions 21 and 22, respectively, is also achieved. Thereafter, contact holes are etched in the LTO 23 in correspondence with the source 21 and drain 22 and gate 12 (step 18). These contact areas are then enhanced to ensure good ohmic contact between the next-to-be-formed metal layer and these various elements 12, 21 and 22 of the memory device. The contact enhancement step typically involves phosphorus oxychloride (POCl$_3$) deposition and thermal diffusion such that the phosphorus ions from the POCl$_3$ layer diffuse into the various contact areas.

Thereafter, a layer of metal such as aluminum is formed over the structure. The metal is next delineated and thereafter alloyed into the areas of silicon with which it is in contact. Two such contacts 24 and 25 are shown in FIG. 6 which make electrical contact with source 21 and drain 22, respectively. The remainder of the process steps such as forming a passivation layer are well-known in the art and it is deemed unnecessary to describe them herein.

Having described a process of forming the laser-beam recrystallized SOI silicon gate field effect transistor, the operation of this memory element will now be traced. Referring to FIG. 6, in operation, for example, when a large (typically about 20-25 volts) positive polarizing potential of pulse width 1-100 milliseconds is applied between the gate 12 and the overlying recrystallized silicon i.e., the channel region 20 (the source 21 and drain 22 being maintained at ground potential), electrons from the recrystallized silicon region 20 will tunnel though the memory oxide 16 corresponding to the gate region and are trapped at the oxide 16-nitride 13' interface and in the nitride 13' bulk. The electrons so trapped will remain there even after removal of the polarizing potential and constitute the nonvolatile memory of the transistor. To erase this memory, a large (20-25 volts, 1-100 ms pulse duration) negative polarizing potential is applied to the gate 12 with respect to the recrystallized silicon region 20 whereupon the electrons trapped in the gate dielectric layers 13' and 16 will return to the silicon region 20 by back tunneling.

It is clear from the foregoing description of the operation of the memory device, the present laser-beam recrystallized SOI field effect transistor is quite similar in its mode of operation to the conventional SNOS FET. Consequently, the present device will be suitable for conveniently taking the place of conventional SNOS FET device without the requirement of any circuit modification.

By using the present process nonvolatile memory devices of excellent retention can be realized. Since the memory oxide 16 formed by thermal oxidation of the nitride 13' (all references to FIG. 6) it is of uniform thickness and of stoichiometric $SiO_2$ quality. Since the memory oxide 16 can be formed in a precisely controlled manner this process yields consistently reliable devices. Another advantage is that this process provides self-isolated devices on a chip since the recrystallized silicon 17' (FIG. 6), which essentially takes the place of the monolithic single crystal silicon substrate in conventional SNOS devices, is patterned into individual device active areas without physical connection between one device active area and an adjacent one. This self-isolation scheme not only reduces the number of device fabrication steps but saves valuable chip real estate.

Although the description of this invention has been confined to a laser beam recrystallized SOI nonvolatile silicon gate n-FET and a process of making the same, this invention is suitable for fabricating its counterpart p-FET. Another modification which is within the realm of this invention is use, in place of the silicon gate, a gate made of a metal or refractory metal silicide.

Another modification is a common-gate, vertically stacked nonvolatile memory device pair formed in a piggy-back configuration. In this version of the present invention first the SNOS structure is formed, for example, on a p-type silicon substrate. Then, steps 4 through 18 (Table I) are accomplished to form a SOI structure thereon. In this configuration the single silicon gate serves as the common gate for the SNOS device and the SOI device.

The process and structure shown and described herein are intended to be illustrative only. The particular parameters used in the description are intended to be illustrative only and are not intended to be limitative of the instant invention. The best known mode of operation is included within the steps and parameters described. However, it is clear that others skilled in the microelectronics art, and beginning with the teachings herein described may define improved detailed process parameters and characteristics. However, such improvements which fall within the scope and spirit of this invention are intended to be included herein as well.

I claim:

1. A method of forming a nonvolatile semiconductor memory element on a substrate comprising:
   forming a conductive gate on a surface portion of said substrate;
   forming a composite dielectric layer on said gate and the remaining surface portion of the substrate, said dielectric layer having a relatively small thickness in a central portion of the gate and relatively large thickness in the remaining portion of the gate and the substrate;
   forming a doped polysilicon layer on said dielectric layer; and
   converting said polysilicon layer into recrystallized silicon.

2. The process as in claim 1 further comprising forming a source and drain in said recrystallized silicon in correspondence with said gate.

3. The process as in claim 2 wherein said dielectric layer is a silicon nitride-silicon oxynitride-silicon dioxide multiple layer.

4. A method of making a nonvolatile semiconductor memory device on a substrate comprising:
   forming a conductive polysilicon gate on a surface portion of the substrate;
   forming a silicon nitride layer on said gate and the remaining surface portion of the substrate;
   forming a relatively thick silicon dioxide layer on said nitride;
   removing said thick oxide corresponding to a central portion of the gate thereby exposing the nitride thereunder;
   thermally oxidizing said exposed nitride layer to form a relatively thin oxide layer thereon;
   forming a doped polysilicon layer on said thin oxide layer and the thick oxide layer;
   subjecting said polysilicon layer to a laser beam to convert the polysilicon layer into a recrystallized silicon layer;
   patterning the recrystallized silicon layer into an active area;
   masking the recrystallized silicon layer in correspondence with the gate; and
   forming source and drain regions in said recrystallized silicon in alignment with the gate.

5. The method of claim 4 further comprising forming an insulator layer on said substrate prior to said gate forming step.

6. A method of making a nonvolatile silicon gate field effect transistor on a substrate comprising:
   forming a conductive n-type polysilicon gate on a surface portion of said substrate;
   forming a first silicon nitride layer on said gate and the remaining surface portion of the substrate;
   forming a relatively thick silicon dioxide layer on said first nitride layer;
   removing said thick oxide corresponding to a central portion of the gate thereby exposing the first nitride layer thereunder;
   thermally oxidizing the structure to form a relatively thin silicon oxynitride-silicon dioxide dual layer on said exposed first nitride and densifying said thick oxide;

forming a polysilicon layer on said thick and thin oxide layers;

implanting said polysilicon layer with p-type impurities;

forming a second silicon nitride layer on said polysilicon layer;

converting said polysilicon layer into recrystallized silicon by subjecting the polysilicon layer via said second nitride to laser radiation;

removing said second nitride-layer;

patterning said recrystallized silicon into the transistor active area;

masking the portion of said patterned recrystallized silicon in correspondence with the underlying gate; and implanting n-type ions in the unmasked portion of said recrystallized silicon forming therein source and drain regions in alignment with the gate.

7. The process as in claim 6 further comprising the step of forming a relatively thick silicon dioxide layer on said substrate prior to said gate formation.

* * * * *